United States Patent
Hsu

(10) Patent No.: US 8,759,164 B2
(45) Date of Patent: Jun. 24, 2014

(54) METHOD FOR MANUFACTURING INTEGRAL IMAGING DEVICE

(75) Inventor: Chia-Ling Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 75 days.

(21) Appl. No.: 13/527,910

(22) Filed: Jun. 20, 2012

(65) Prior Publication Data

US 2013/0217161 A1 Aug. 22, 2013

(30) Foreign Application Priority Data

Feb. 21, 2012 (TW) .............................. 101105708 A

(51) Int. Cl.
*H01L 21/20* (2006.01)

(52) U.S. Cl.
USPC ................. 438/141; 438/31; 438/70; 438/99; 257/E21.006; 257/E21.007; 257/E21.014; 257/E21.051; 257/E21.053; 257/E21.134; 257/E21.151; 257/E21.189; 257/E21.267; 257/E21.329; 257/E21.347; 257/E21.367; 257/E21.366

(58) Field of Classification Search
USPC ............. 438/30, 31, 69, 70, 75, 99, 141, 149, 438/160; 257/E21.006, E21.007, E21.014, 257/E21.051, E21.053, E21.134, E21.151, 257/E21.189, E21.267, E21.329, E21.347, 257/E21.361, E21.366
See application file for complete search history.

(56) References Cited

U.S. PATENT DOCUMENTS

| | | | |
|---|---|---|---|
| 6,964,226 B2 * | 11/2005 | Weiss et al. .................... | 101/129 |
| 7,004,610 B2 * | 2/2006 | Yamashita et al. ............ | 362/606 |
| 7,430,355 B2 * | 9/2008 | Heikenfeld et al. .......... | 385/129 |
| 8,013,831 B2 * | 9/2011 | Sampsell ....................... | 345/102 |
| 8,434,909 B2 * | 5/2013 | Nichol et al. ............. | 362/296.01 |

\* cited by examiner

*Primary Examiner* — David Nhu
(74) *Attorney, Agent, or Firm* — Novak Druce Connolly Bove + Quigg LLP

(57) ABSTRACT

In a method for manufacturing an integral imaging device, a layer of curable adhesive is first applied on a flexible substrate and half cured such that the curable adhesive is solidified but is capable of deforming under external forces. Then the curable adhesive is printed into a lenticular lens having a predetermined shape and size using a roll-to-roll processing device and fully cured such that the curable adhesive is capable of withstanding external forces to hold the predetermined shape and size. Last, a light emitting diode display is applied on the flexible substrate opposite to the lenticular lens such that an image plane of the light emitting diode display coincides with a focal plane of the lenticular lens.

12 Claims, 3 Drawing Sheets

METHOD FOR MANUFACTURING INTEGRAL IMAGING DEVICE

This application claims the benefit of priority under 35 USC 119 from Taiwan Patent Application 101105708, filed on Feb. 21, 2012.

BACKGROUND

1. Technical Field

The present disclosure relates to stereo displays and, particularly, to a method for manufacturing an integral imaging device.

2. Description of Related Art

Integral imaging devices display a 3D image using lenticular lenses, each of which include an array of cylindrical lenses, precisely aligned in front of an array of image pixels, where each cylindrical lens looks different depending on viewing angle, thus creating a stereo effect that exhibits parallax when viewers move. To ensure display quality, it is required that the cylindrical lenses precisely align with the pixels, which is difficult and/or inefficient.

Therefore, it is desirable to provide a method for manufacturing an integral imaging device which can overcome the above-mentioned shortcomings.

DETAILED DESCRIPTION

Embodiments of the disclosure will be described in detail, with reference to the accompanying drawings.

Figure 1:
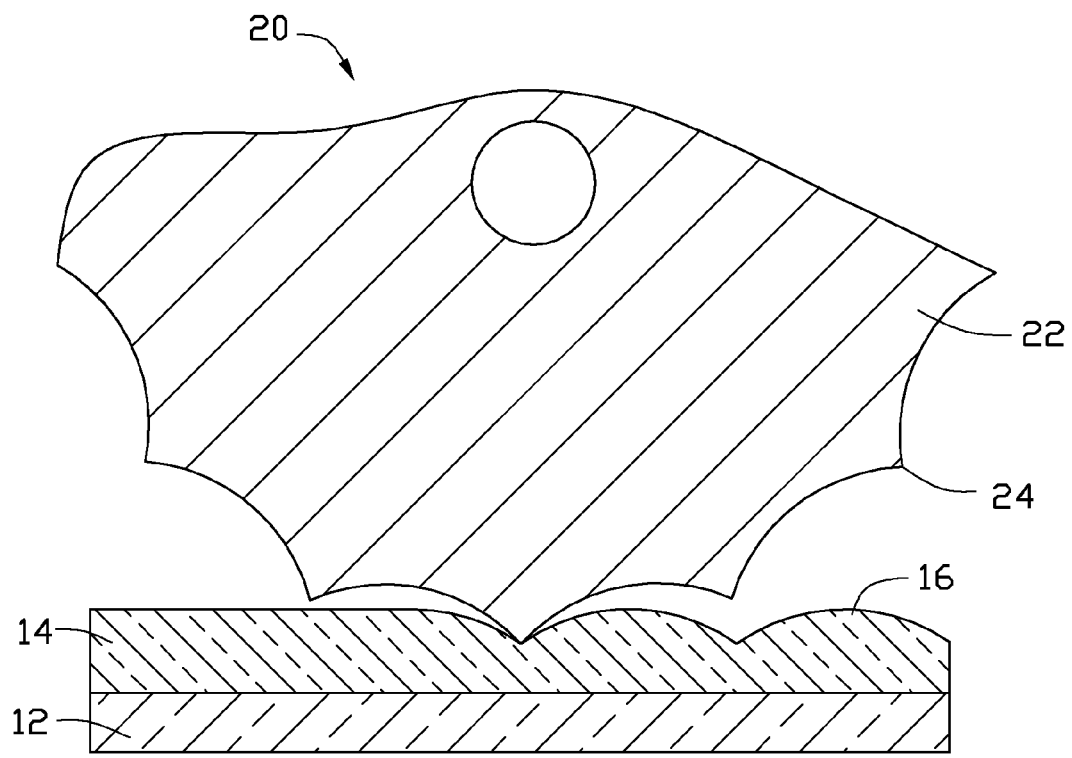
FIG. 1 is a schematic view showing how to implement a step of a method for manufacturing an integral imaging device according to an embodiment.
Figure 2:
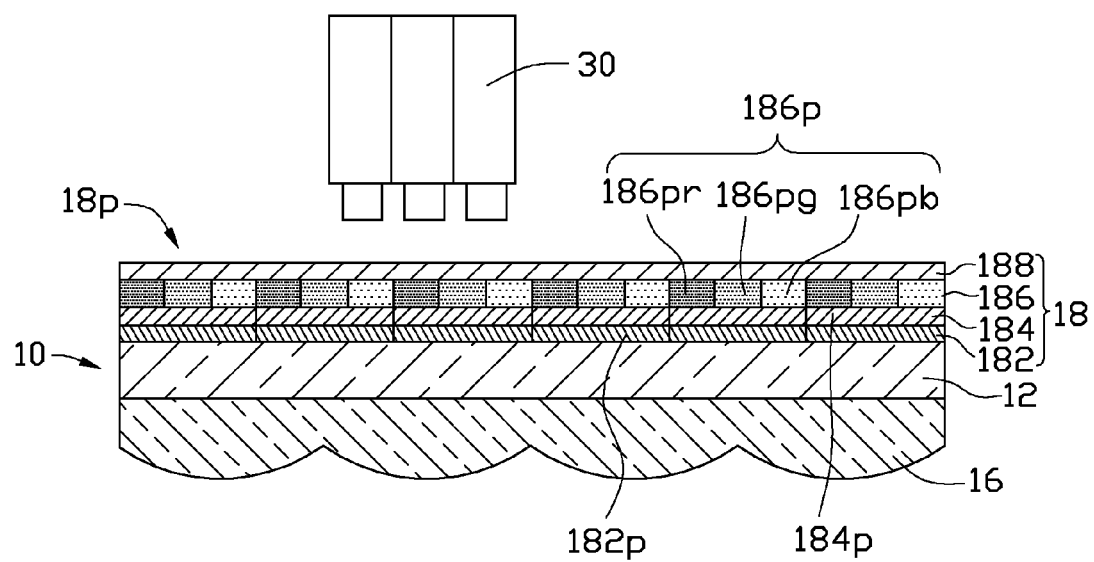
FIG. 2 is a schematic view showing how to implement another step of a method for manufacturing an integral imaging device according to an embodiment.
Figure 3:
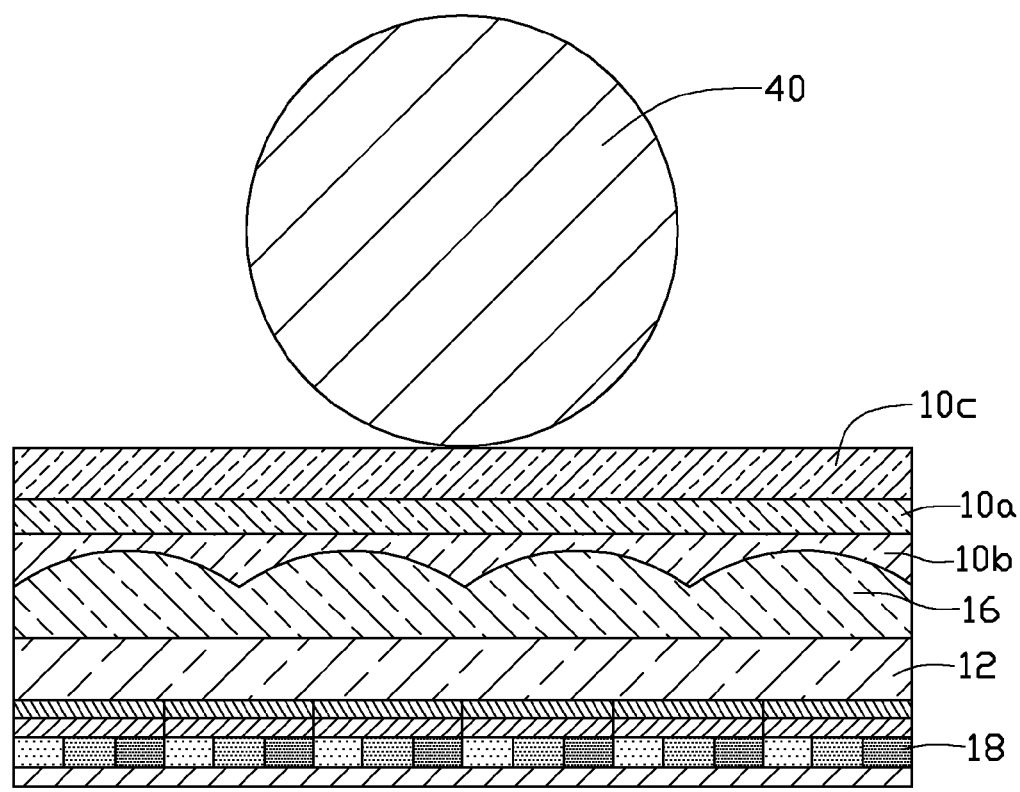
FIG. 3 is a schematic view showing how to implement yet another step of a method for manufacturing an integral imaging device according to an embodiment.

Referring to FIGS. 1 and 2, a method for manufacturing an integral imaging device 10 includes the following steps S01-S05.

In step S01, a layer of curable adhesive 14 is applied on a flexible substrate 12 and is half cured such that the curable adhesive 14 is solidified but can be deformed by external forces. As such, the curable adhesive 14 can be shaped as desired.

The flexible substrate 12 can be a hot melt adhesive film, such as a polyethylene terephthalate (PET) or a polyether sulfone (PES) film. The curable adhesive 14 can be ultraviolet (UV) curable adhesive.

In step S02, the curable adhesive 14 is printed by a roll-to-roll (R2R) processing device 20 to form a lenticular lens 16 having a predetermined shape and size and is fully cured such that the curable adhesive 14 can withstand external force to hold the predetermined shape and size.

The R2R processing device 20 includes a roller 22 having a characteristic structure 24, which is complementary to the lenticular lens 16. The characteristic structure 24 is formed in a cylindrical surface thereof by precision carving using a blade. The predetermined shape and size of the lenticular lens 16 can be determined by setting a radius and a moving trajectory of the blade.

In step S03, a light emitting diode (LED) display 18 is formed on the flexible substrate 12 opposite to the lenticular lens 16 such that an image plane of the LED display 18 coincides with a focal plane of the lenticular lens 16.

As the lenticular lens 16 and the LED display 18 are formed at opposite sides of the same flexible substrate 12, precision alignment therebetween is facilitated. For example, a coordinate system can be defined on the flexible substrate 12, and the printing of the lenticular lens 16 and the forming of the LED display 18 are both carried out in the coordinate system.

The LED display 18 can be a polymer LED (PLED) display and is formed by an ink-jet printer 30 using macromolecular organic materials to improve production efficiency. To increase luminous efficiency of the LED display, the macromolecular organic materials can be doped with metal nanoparticles.

In other embodiments, the LED display 18 can be an organic LED (OLED) display with high luminous efficiency and is formed by vacuum sputtering using small molecule organic materials.

The LED display 18 includes a thin-film transistor (TFT) layer 182 including an array of TFTs 182$p$, a transparent cathode layer 184 including an array of cathodes 184$p$ and formed on the TFT layer 182, a color filter layer 186 including an array of color filters 186$p$ and formed on the transparent cathode layer 184, and a reflective anode layer 188 formed on the color filter layer 186. The TFTs 182$p$, cathodes 184$p$, and color filters 186$p$ are respectively aligned with each other to form pixels 18$p$ of the LED display 18. Each color filter 186$p$ includes a red part 186$pr$, a green part 186$pg$, and a blue part 186$pb$.

In step S04, a flexible touch panel 10$a$ is pasted to the lenticular lens 16, opposite to the LED display 18. The flexible touch panel 10$a$ is capacitance type and pasted using optical clear adhesive (OCA) 10$b$. Silver nanowires can be employed as conductive materials of the flexible touch panel 10$a$ and sensors of the flexible touch panel 10$a$ can be formed by ink-jet printing.

In step S05, a protective film 10$c$ is pasted on the flexible touch panel 10$a$, opposite to the lenticular lens 16. The protective film 10$c$ can be hot melt adhesive too. In alternative embodiment, the protective film 10$c$ can be formed on the flexible touch panel 10$a$ first, then a combination of the flexible touch panel 10$a$ and the protective film 10$c$ is pasted to the lenticular lens 16 via the OCA 10$b$ applied using a roller 40.

Particular embodiments are shown here and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A method for manufacturing an integral imaging device, the method comprising:

distributing a layer of curable adhesive to a flexible substrate;

half curing the curable adhesive layer such that the curable adhesive layer is solidified but is capable of deforming upon external forces;

printing the curable adhesive layer into a lenticular lens having a predetermined shape and size using a roll-to-roll processing device;

fully curing the curable adhesive layer such that the curable adhesive layer is capable of withstanding external forces to hold the predetermined shape and size; and forming a light emitting diode display on the flexible substrate opposite to the lenticular lens such that an image plane of the light emitting diode display coincides with a focal plane of the lenticular lens.

2. The method of claim 1, wherein the flexible substrate is a hot melt adhesive film.

3. The method of claim 1, wherein the flexible substrate is selected from the group consisting of a polyethylene terephthalate film and a polyether sulfone film.

4. The method of claim 1, wherein the curable adhesive layer is ultraviolet curable adhesive.

5. The method of claim 1, wherein the roll-to-roll processing device comprise a roller having a characteristic structure, which is complementary to the lenticular lens, formed in a cylindrical surface thereof by precision carving.

6. The method of claim 1, wherein the light emitting diode display is a polymer light emitting diode display and is formed by an ink-jet printing using macromolecular organic materials.

7. The method of claim 2, wherein the light emitting diode display is an organic light emitting diode display and is formed by vacuum sputtering using small molecule organic materials.

8. The method of claim 1, wherein the light emitting diode display comprises a thin-film transistor layer including an array of thin-film transistors, a transparent cathode layer including an array of cathodes and formed on the thin-film transistor layer, a color filter layer including an array of color filters and formed on the transparent cathode layer, and a reflective anode layer formed on the color filter layer, each thin-film transistor, each cathode, and each color filter are aligned with each other to form a pixel of the LED display, and each color filter includes a red part, a green part, and a blue part.

9. The method of claim 1, further comprising:
pasting a flexible touch panel to the lenticular lens, opposite to the LED display.

10. The method of claim 9, wherein the flexible touch panel is pasted using optical clear adhesive.

11. The method of claim 9, further comprising:
pasting a protective film to the flexible touch panel, opposite to the lenticular lens.

12. The method of claim 11, wherein the protective film is made of hot melt adhesive.

\* \* \* \* \*